(12) United States Patent
Kim

(10) Patent No.: US 8,685,852 B2
(45) Date of Patent: Apr. 1, 2014

(54) METHOD OF FORMING METAL LINE OF SEMICONDUCTOR DEVICE

(75) Inventor: Jin Gu Kim, Suwon-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 337 days.

(21) Appl. No.: 13/222,501

(22) Filed: Aug. 31, 2011

(65) Prior Publication Data

US 2011/0309524 A1    Dec. 22, 2011

Related U.S. Application Data

(62) Division of application No. 11/965,827, filed on Dec. 28, 2007, now Pat. No. 8,030,203.

(30) Foreign Application Priority Data

Mar. 6, 2007    (KR) .................. 10-2007-0021769
Mar. 20, 2007    (KR) .................. 10-2007-0027221

(51) Int. Cl.
*H01L 21/4763* (2006.01)

(52) U.S. Cl.
USPC ........................................ 438/634

(58) Field of Classification Search
CPC ............ H01L 21/76802; H01L 21/76829; H01L 21/31116; H01L 21/768; H01L 23/48
USPC .......... 257/324, 738, 774, E21.145, E21.579, 257/E23.011; 438/620, 634, 637
See application file for complete search history.

(56) References Cited

U.S. PATENT DOCUMENTS

| 2004/0201053 | A1 | 10/2004 | Tu et al. |
| 2005/0026422 | A1 | 2/2005 | Kim et al. |
| 2005/0184394 | A1 | 8/2005 | Lee et al. |

FOREIGN PATENT DOCUMENTS

| KR | 1020010045400 | 6/2001 |
| KR | 1020030058523 | 7/2003 |
| KR | 1020040001989 | 1/2004 |
| KR | 1020060076499 | 7/2006 |
| KR | 1020060120989 | 11/2006 |

OTHER PUBLICATIONS

Korean Notice of Allowance for 10-2007-0027221.
Korean Office Action for 10-2007-0021769.

*Primary Examiner* — Nikolay Yushin
(74) *Attorney, Agent, or Firm* — Lowe Hauptman & Ham, LLP

(57) ABSTRACT

A semiconductor device and a method of forming a metal line of a semiconductor device includes a first insulating layer formed over a semiconductor substrate an etch-stop layer formed over the first insulating layer, contact holes formed by etching the etch-stop layer and the first insulating layer, Contact plugs formed within the contact holes and a second insulating layer formed over the contact plugs and the etch-stop layer. The second insulating layer is etched in order to form trenches through which the contact plugs are exposed. Metal lines are formed within the trenches. Accordingly, since a hard mask with a high dielectric constant does not remain between the metal lines, the capacitance of the metal lines can be reduced.

13 Claims, 6 Drawing Sheets

METHOD OF FORMING METAL LINE OF SEMICONDUCTOR DEVICE

CROSS-REFERENCES TO RELATED APPLICATIONS

The present application is a Divisional Application of U.S. patent application Ser. No. 11/965,827, filed Dec. 28, 2007, which claims priority to Korean patent application number 10-2007-21769 filed on Mar. 6, 2007, and Korean patent application number 10-2007-27221 filed on Mar. 20, 2007, which are incorporated by reference in its entirety.

BACKGROUND OF THE INVENTION

The present invention generally relates to a semiconductor device and a method of forming metal lines in the semiconductor device and, more particularly, to a semiconductor device and a method of forming metal lines in the semiconductor device, in which the capacitance of the metal lines can be reduced.

Presently, since semiconductor device have become highly integrated, the density of elements per unit area has been increased and the density of interconnection lines formed in a semiconductor device has also been increased. The interconnection line is connected to a source region, a drain region and a gate of a transistor, which is disposed several thousands of μm from the line, and functions to supply the power and transfer signals. The interconnection line is generally formed of a metal line. A metal line is frequently used as a local interconnection line between respective unit circuits.

However, there is a need for a semiconductor device structure having a multi-layered metal line. Thus, resistance existing between adjacent metal lines on the same layer or between respective metal lines, which are adjacent above and below, is increased. Accordingly, research has been made to reduce resistance of metal lines in a single or a multi-layered metal line structure.

However, if the height or width of a metal line is increased in order to reduce resistance of the metal line, the capacitance of the metal line is increased. This capacitance of the metal line can be further increased due to a hard mask with a high dielectric constant, which is used to form a metal line using a damascene process and subsequently remains between metal lines. These capacitance components degrade the electrical performance of a semiconductor device due to delay caused by RC, and further increase power consumption of the semiconductor device and also signal leakage.

BRIEF SUMMARY OF THE INVENTION

According to the present invention, when forming metal lines using a damascene process, a hard mask with a high dielectric constant does not remain between the metal lines. Accordingly, the capacitance of metal lines can be reduced.

Furthermore, according to the present invention, trenches are formed using a polysilicon layer, constituting a contact plug, as a hard mask. Accordingly, metal lines can be formed more conveniently.

A method of forming metal lines of a semiconductor device according to an embodiment of the present invention includes forming a first insulating layer over a semiconductor substrate, forming an etch-stop layer over the first insulating layer, forming contact holes by etching the etch-stop layer and the first insulating layer, forming contact plugs within the contact holes, forming a second insulating layer over the contact plugs and the etch-stop layer, etching the second insulating layer, thus forming trenches through which the contact plugs are exposed, and forming metal lines within the trenches.

The etch-stop layer may be formed of a material with a dielectric constant higher than that of an oxide layer. The etch-stop layer may be formed of a nitride layer. The etch-stop layer may be formed to a thickness of 10 to 10000 angstrom. The metal lines may be formed using a damascene process. The metal lines may be formed over the etch-stop layer.

A method of forming metal lines of a semiconductor device according to another embodiment of the present invention includes forming a first insulating layer over a semiconductor substrate, forming an etch-stop layer on the first insulating layer, forming a second insulating layer on the etch-stop layer, etching the second insulating layer, the etch-stop layer and the first insulating layer, thus forming contact holes, forming contact plugs within the contact holes by forming a conductive layer over an overall surface including the contact holes, etching the second insulating layer, thus forming trenches through which the contact plugs are exposed, and forming metal lines within the trenches.

The etch-stop layer may be formed of a material with a dielectric constant higher than that of an oxide layer. The etch-stop layer may be formed of a nitride layer. Part of the conductive layer may constitute a hard mask on the second insulating layer. The trenches may be formed using an etch process employing the hard mask. The metal lines may be formed using a damascene process. The metal lines may be formed over the etch-stop layer. The conductive layer may include polysilicon or tungsten (W). A process of lowering a height of the contact plugs may be further performed after the trenches are formed.

A semiconductor device according to yet another embodiment of the present invention includes a first insulating layer formed over a semiconductor substrate, an etch-stop layer formed over the first insulating layer, contact plugs formed in the first insulating layer and the etch-stop layer and having bottoms connected to the semiconductor substrate, a second insulating layer formed on the etch-stop layer, and metal lines formed in the second insulating layer.

The metal lines may be electrically connected to the contact plugs.

DESCRIPTION OF SPECIFIC EMBODIMENTS

Now, specific embodiments according to the present invention will be described with reference to the accompanying drawings.

However, the present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

Figure 1:
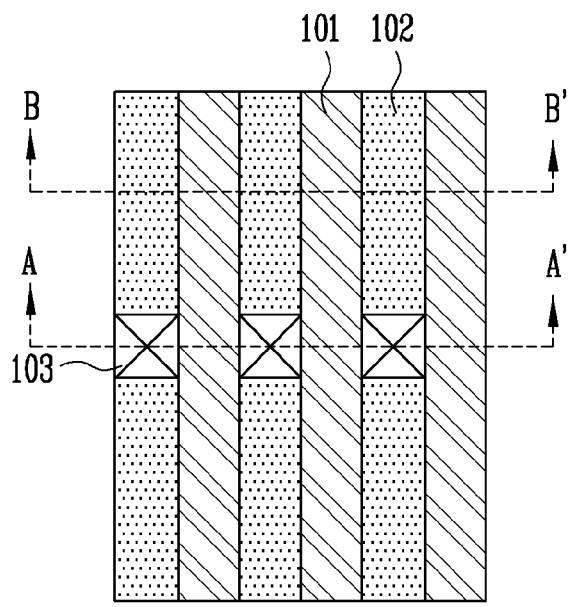
FIG. 1 is a layout diagram of a semiconductor device for illustrating a method of forming metal lines of a semiconductor device according to an embodiment of a present invention.

FIG. 1 is a layout diagram of a semiconductor device for illustrating a method of forming metal lines of a semiconductor device according to an embodiment of a present invention.

Referring to FIG. 1, a plurality of isolation regions 101 and active regions 102 are alternately formed in a semiconductor substrate. An isolation layer (not shown) is formed in the isolation region 101, and a junction region (not shown) including drain/source regions, a gate (not shown), etc. are formed in the active region 102. Meanwhile, an insulating layer is formed over the active region 102. A contact plug 103 connected to the junction region (not shown) formed in the active region 102 is formed in the insulating layer. A metal line (not shown) is formed over the contact plug 103 in order to connect the junction region (not shown) and the metal line (not shown). The method of forming the metal line is described in more detail below.

FIGS. 2A to 2D are sectional views illustrating a method of forming metal lines of a semiconductor device according to a first embodiment of the present invention.

In particular, FIGS. 2A to 2D illustrate a cell region of a semiconductor substrate 202. A region A indicated in FIGS. 2A to 2D shows a cross section of a portion taken along line A-A' in FIG. 1, and a region B shows a cross section of a portion taken along line B-B' in FIG. 1.

Figure 2A:
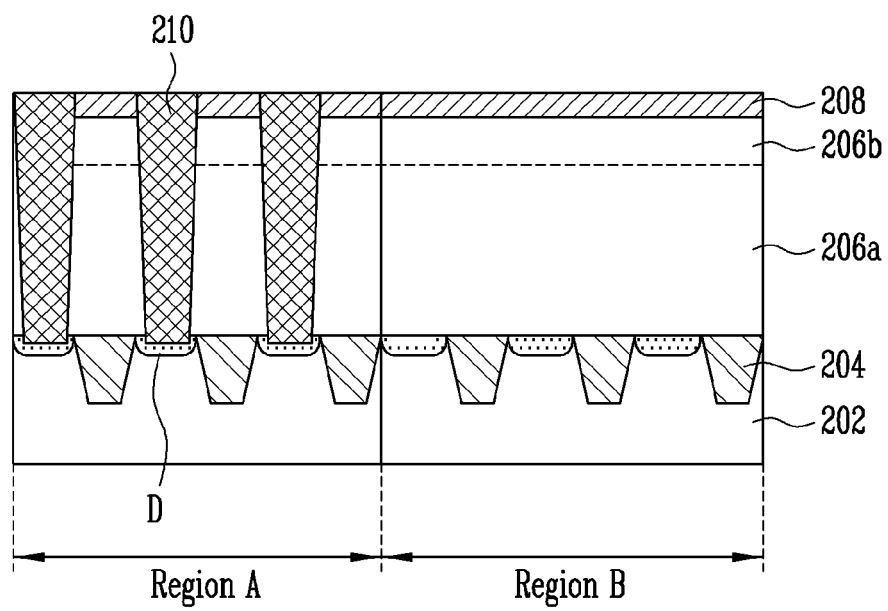
FIGS. 2A to 2D are sectional views illustrating a method of forming metal lines of a semiconductor device according to a first embodiment of the present invention.

Referring to FIG. 2A, a plurality of isolation layers 204 are formed in the semiconductor substrate 202 including a cell region and a peripheral region (not shown), thus defining active regions between the isolation layers 204. In the cell region are formed a plurality of cell strings (not shown). The cell string (not shown) is formed by connecting a source select transistor (not shown), a plurality of memory cells (not shown) and a drain select transistor (not shown). Meanwhile, in the peripheral region (not shown) is formed a peripheral transistor (not shown).

An ion implantation process is performed on the semiconductor substrate 202 in order to form a junction region in the active region. At this time, a junction region formed in the active region between adjacent drain select transistors serves as a drain region D. A junction region formed in the active region between the source select transistors serves as a source region (not shown). A plurality of the junction regions are also formed between the memory cells.

A first insulating layer 206a is formed over the semiconductor substrate 202. The first insulating layer 206a is etched in order to form source contact holes (not shown). An etch-stop layer may be further formed below the first insulating layer 206a. The first insulating layer 206a may be formed of an oxide layer. After the source contact holes are gap filled with a conductive layer, a polishing process such as a Chemical Mechanical Polishing (CMP) method is performed in order to form a source contact plug (not shown).

A second insulating layer 206b is formed on the first insulating layer 206a including the source contact plug. An etch-stop layer 208 is formed on the second insulating layer 206b. The second insulating layer 206b may be formed of an oxide layer. The etch-stop layer 208 may be formed to a thickness of 10 to 10000 angstrom using a material having a dielectric constant, which is higher than (for example, about twice) that of a nitride layer or an oxide layer.

The etch-stop layer 208, the second insulating layer 206b, the first insulating layer 206a, and the etch-stop layer (not shown) are partially etched in order to form drain contact holes. The drain regions D formed in the semiconductor substrate 202 are exposed at the bottoms of the drain contact holes. After the drain contact holes are gap filled with a conductive layer, a polishing process, such as a CMP method, or an etch back process is performed in order to form drain contact plugs 210. The drain contact plugs 210 are connected to the drain regions D formed in the semiconductor substrate 202 electrically and physically.

Figure 2B:
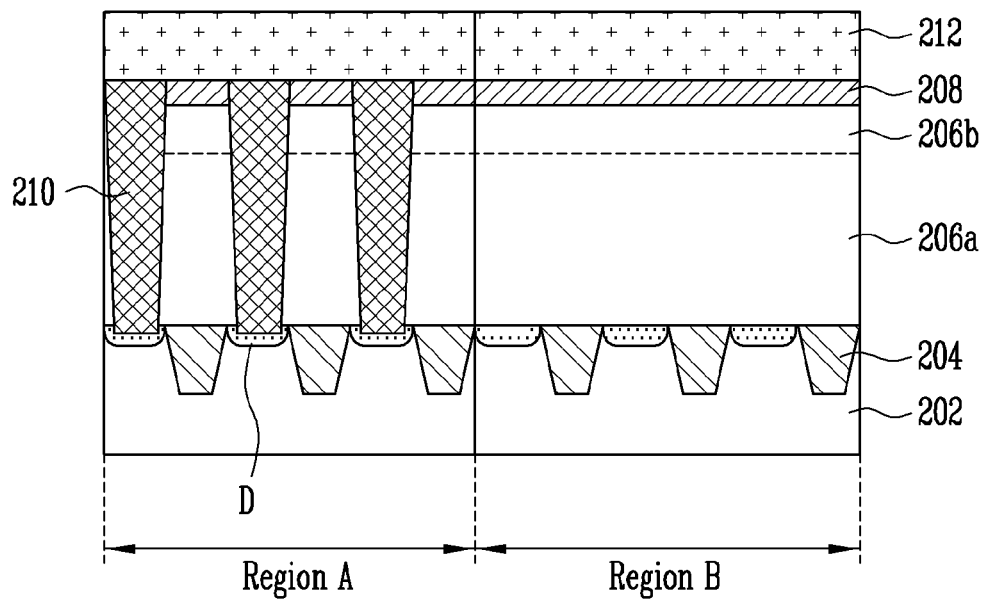

Referring to FIG. 2B, a trench dielectric layer 212 is formed on the etch-stop layer 208 including the drain contact plugs 210. The trench dielectric layer 212 functions to provide a step in order to form metal lines employing a damascene process in a subsequent process, and may be formed of an oxide layer.

Figure 2C:
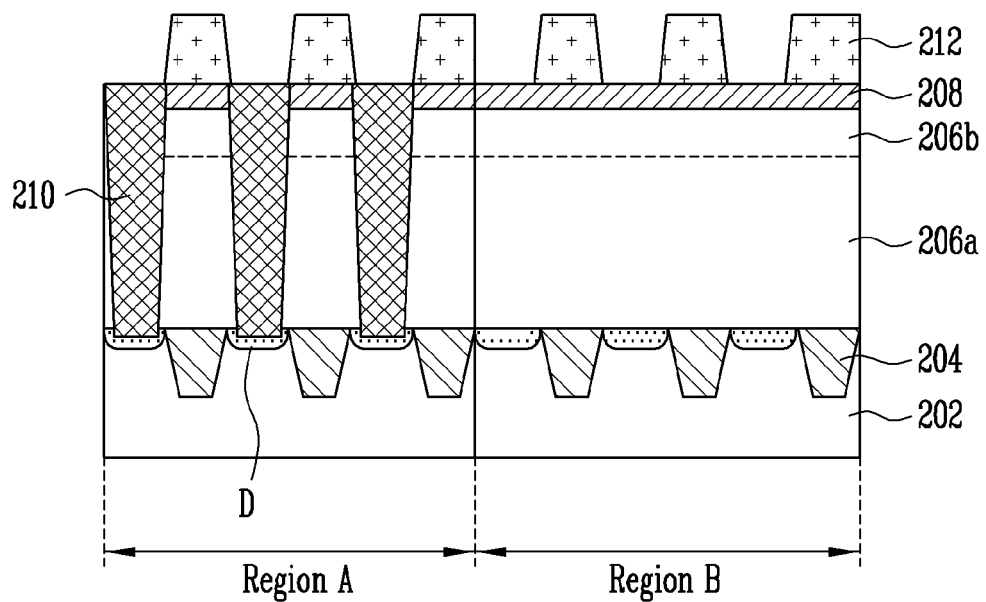

Referring to FIG. 2C, the trench dielectric layer 212 of regions where metal lines will be formed is removed by performing an etch process employing a mask. At this time, in the region A, the drain contact plugs 210 serves as an etch stopper and in the region B, the etch-stop layer 208 serves as an etch stopper.

Figure 2D:
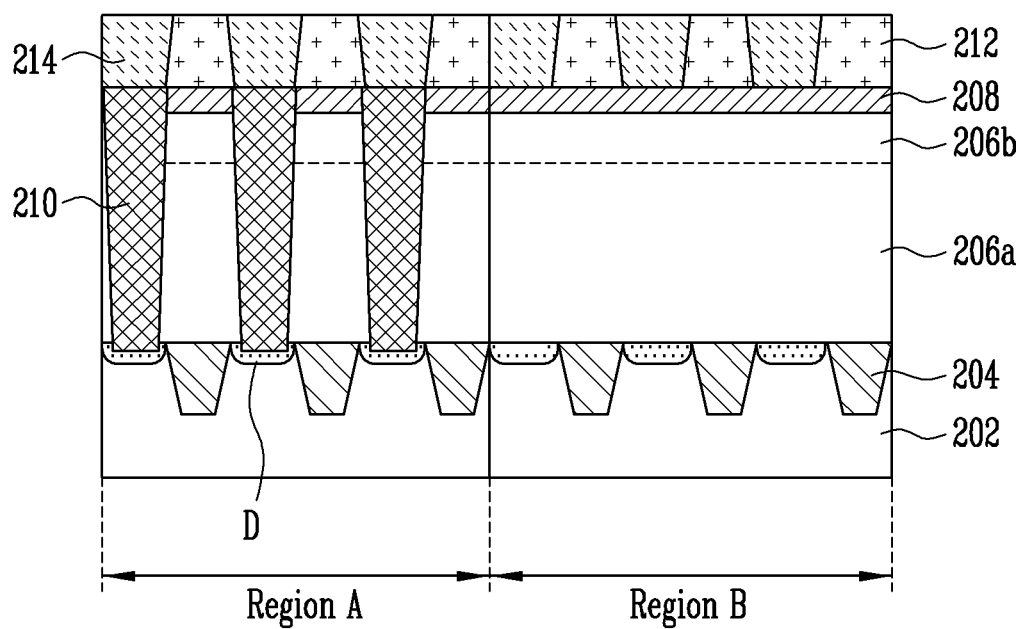

Referring to FIG. 2D, a barrier metal layer (not shown), such as a stack layer of Ti/TiN, is formed on the entire surface including the trench dielectric layer 212. A metal layer, such as tungsten (W), is then formed. A polishing process, such as a CMP process, or an etch back process is then performed in order to form metal lines 214.

When forming the metal lines using a damascene process conventionally, the drain contact plugs are formed and thereafter an etch-stop layer of a nitride layer is formed on the second insulating layer and the drain contact plugs. In other words, after the etch-stop layer and the trench dielectric layer are formed over the second insulating layer and the drain contact plugs, the trench dielectric layer and the etch-stop layer may be partially removed, thus forming the trenches, and the trenches may be then gap filled with a metal layer in order to form the metal lines. At this time, in the process of etching the etch-stop layer in order to expose the drain contact plugs, the underlying second insulating layer is also etched, so the trenches are formed deeper than a depth where the etch-stop layer is formed. Thus, if the metal lines are formed in the trenches, the etch-stop layer is located between the metal lines. Accordingly, the nitride layer with a dielectric constant twice higher than that of the oxide layer remains between the metal lines, increasing the capacitance between the metal lines. This capacitance is included in the capacitance of the metal lines. Consequently, a problem arises because the capacitance of the metal lines is increased. If the thickness of the etch-stop layer is lowered in order to solve this problem, other problems arise because the etch-stop layer can be damaged when etching the trench dielectric layer and the metal lines can be formed irregularly.

However, according to the present invention, the etch-stop layer 208 is formed on the second insulating layer 206b, and the etch-stop layer 208, the second insulating layer 206b and the first insulating layer 206a are then etched in order to form the drain contact plugs 210. Thus, the etch-stop layer 208 does not remain on the drain contact plugs 210. Accordingly, when the trenches are formed in the trench dielectric layer 212 formed on the etch-stop layer 208 and then gap filled in order to form the metal lines 214 connected to the drain contact plugs 210, the metal lines 214 are formed on the etch-stop layer 208. Consequently, since the etch-stop layer 208 does not remain between the metal lines 214, the problem of increased capacitance between the metal lines 214 due to the etch-stop layer 208 can be prevented.

FIGS. 3A to 3F are sectional views illustrating a method of forming metal lines of a semiconductor device according to a second embodiment of the present invention. In particular, FIGS. 3A to 3F illustrate a cell region. A region A indicated in FIGS. 3A to 3F shows a cross section of a portion taken along line A-A' in FIG. 1, and a region B shows a cross section of a portion taken along line B-B' in FIG. 1.

Figure 3A:
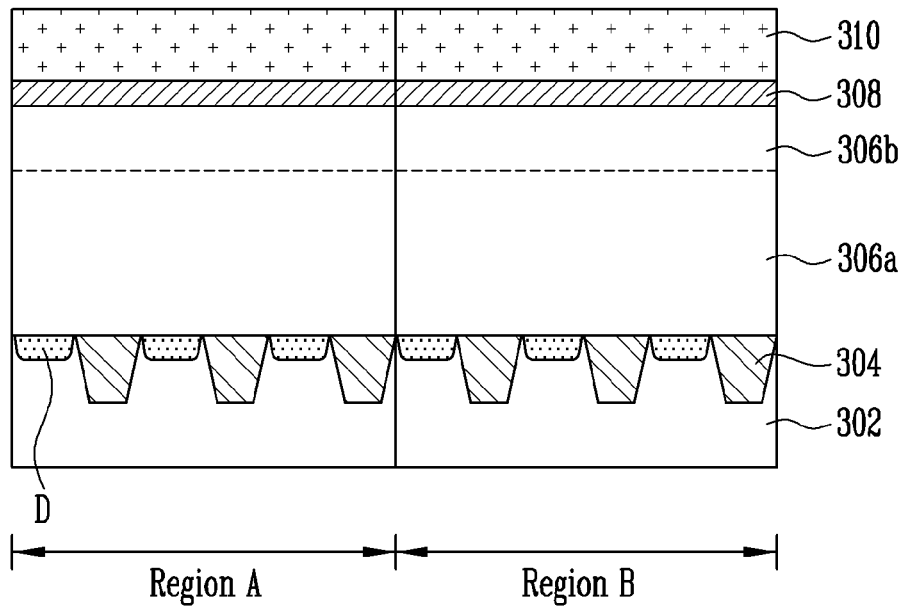
FIGS. 3A to 3F are sectional views illustrating a method of forming metal lines of a semiconductor device according to a second embodiment of the present invention.

Referring to FIG. 3A, a plurality of isolation layers 304 are formed in a semiconductor substrate 302 including a cell region and a peripheral region (not shown), thus defining active regions between isolation layers 304. In the cell region are formed a plurality of cell strings (not shown). The cell string (not shown) is formed by connecting a source select transistor (not shown), a plurality of memory cells (not shown) and a drain select transistor (not shown). Meanwhile, in the peripheral region (not shown) is formed a peripheral transistor (not shown).

An ion implantation process is performed on the semiconductor substrate 302 in order to form a junction region in the active region. At this time, a junction region formed in the active region between adjacent drain select transistors serves as a drain region D. A junction region formed in the active region between the source select transistors serves as a source region (not shown). A plurality of the junction regions are also formed between the memory cells.

A first insulating layer 306a is formed over the semiconductor substrate 302. The first insulating layer 306a may be formed of an oxide layer. An etch-stop layer (not shown) may be further formed below the first insulating layer 306a. The first insulating layer 306a is etched in order to form contact holes (not shown) through which the source region is exposed. The contact hole is gap filled with a conductive layer in order to form source contact plugs (not shown). A second insulating layer 306b is formed on the first insulating layer 306a including the source contact plugs (not shown). An etch-stop layer 308 is formed on the second insulating layer 306b. The second insulating layer 306b may be formed of an oxide layer. The etch-stop layer 308 may be formed to a thickness of 1 to 5000 angstrom using a material having a dielectric constant, which is higher than (for example, about twice) that of a nitride layer or an oxide layer.

A trench dielectric layer 310 is formed on the etch-stop layer 308. The trench dielectric layer 310 functions to provide a step in order to form metal lines employing a damascene process in a subsequent process, and may be formed of an oxide layer to a thickness of 1 to 5000 angstrom.

Figure 3B:
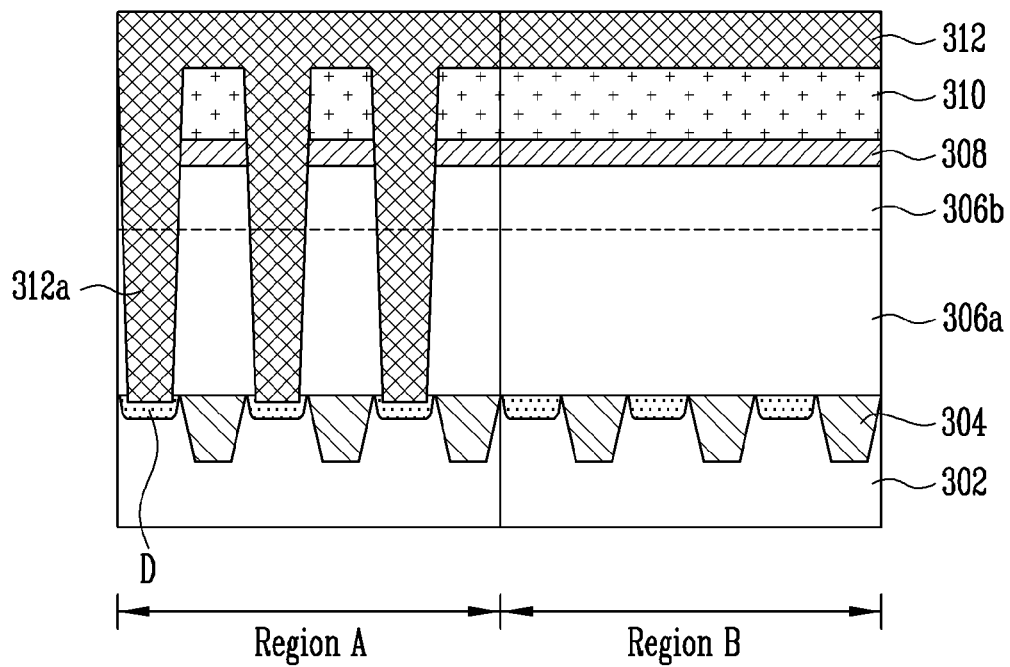

Referring to FIG. 3B, the trench dielectric layer 310, the etch-stop layer 308, the second insulating layer 306b, the first insulating layer 306a and the etch-stop layer (not shown) are partially etched, thus forming drain contact holes. The drain regions D formed in the active regions of the semiconductor substrate 302 are exposed at the bottoms of the drain contact holes. A conductive layer, such as polysilicon or tungsten (W), is formed over the entire surface of the semiconductor substrate 302 including the drain contact holes. At this time, the conductive layer within the drain contact holes become drain contact plugs 312a, and the conductive layer on the trench dielectric layer 310 is used as a hard mask layer 312 in a subsequent process. The drain contact plugs 312a are electrically connected to the drain regions D formed in the semiconductor substrate 302. The conductive layer on the trench dielectric layer 310 may be formed to a thickness of 10 to 5000 angstrom. Accordingly, the hard mask layer 312 may be formed to a thickness of 10 to 5000 angstrom.

Figure 3C:
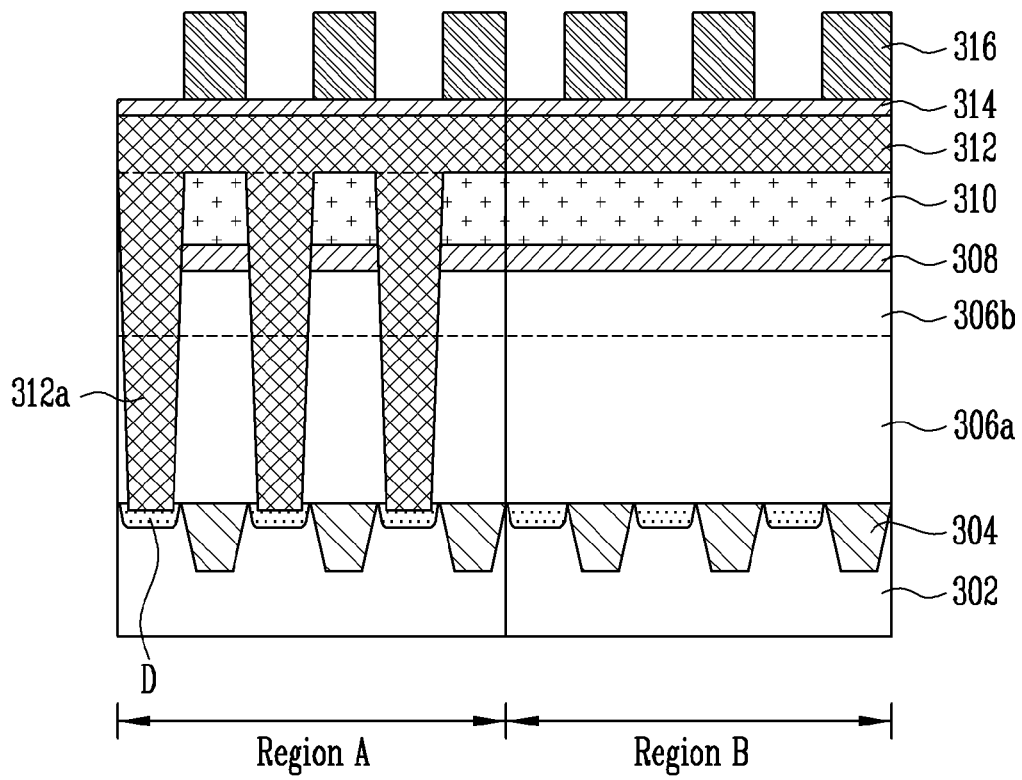

Referring to FIG. 3C, a photoresist pattern 316 is formed over the hard mask layer 312. An anti-reflective coating layer 314 may be further formed below the photoresist pattern 316. The photoresist pattern 316 may be formed to open the top of the metal lines formed in a subsequent process.

Figure 3D:
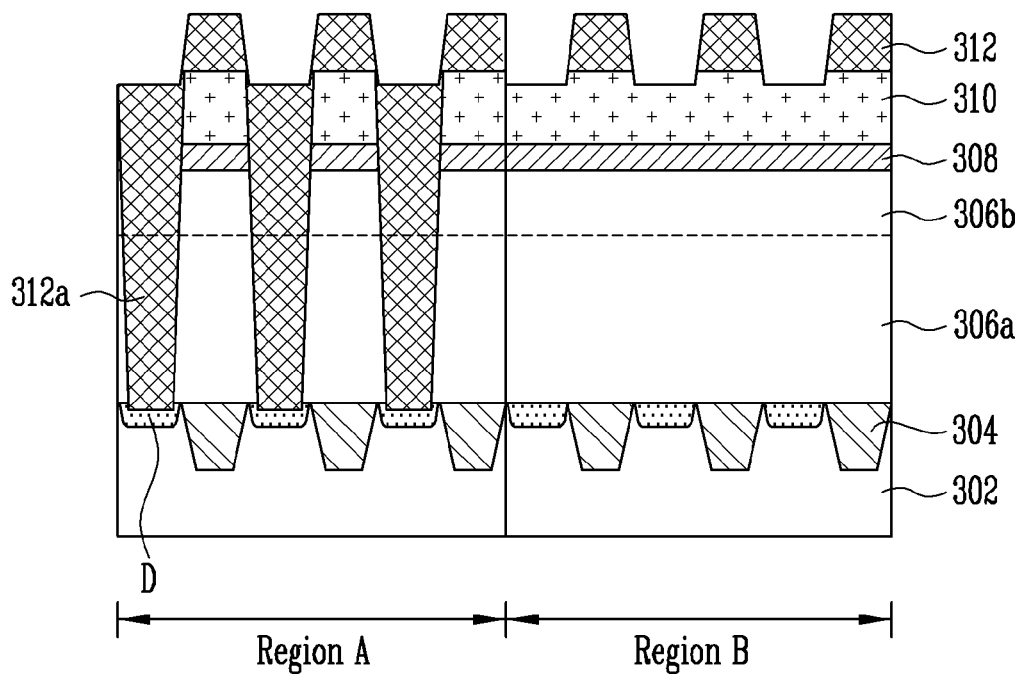

Referring to FIG. 3D, the anti-reflective coating layer and the hard mask layer 312 are patterned by performing an etch process using the photoresist pattern 316 (refer to FIG. 3C) as an etch mask. The photoresist pattern 316 and the anti-reflective coating layer 314 are then removed.

Figure 3E:
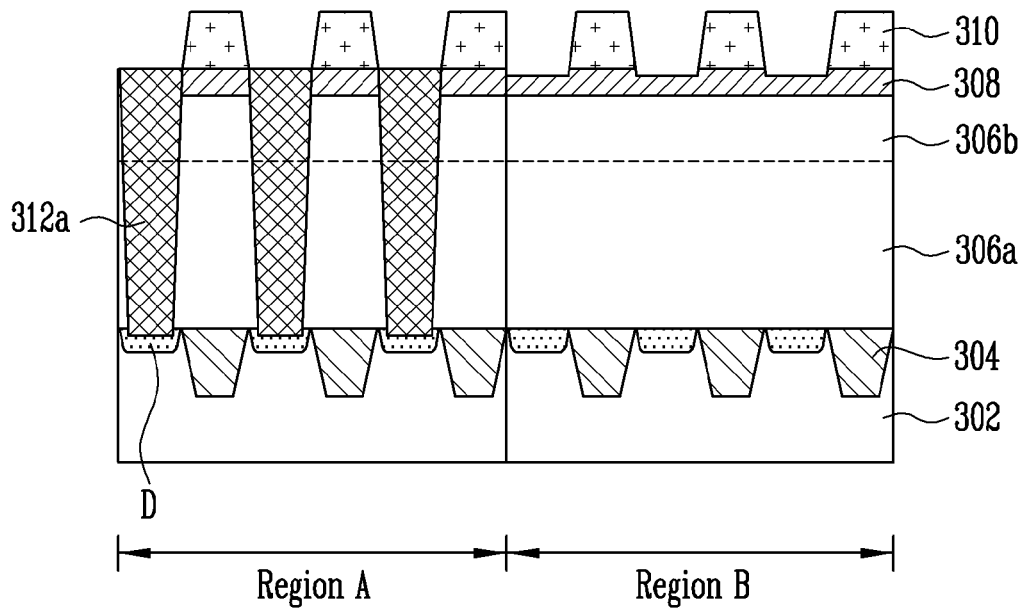

Referring to FIG. 3E, the trench dielectric layer 310 of regions where metal lines will be formed is removed by performing an etch process employing the hard mask layer 312 (refer to FIG. 3D), thus forming trenches. At this time, in the region B, the etch-stop layer 308 may serve as an etch stopper. The hard mask layer 312 (refer to FIG. 3D) is then removed. At this time, in the region A, part of top surfaces of the drain contact plugs 312a is removed, so trenches may be formed in the trench dielectric layer 310.

Meanwhile, after the trenches are formed in the trench dielectric layer 310, an etch back process may be performed additionally in order to lower the height of the drain contact plugs 312a. Thus, the top surfaces of the drain contact plugs 312a may be formed lower than the bottom of the etch-stop layer 308.

Figure 3F:
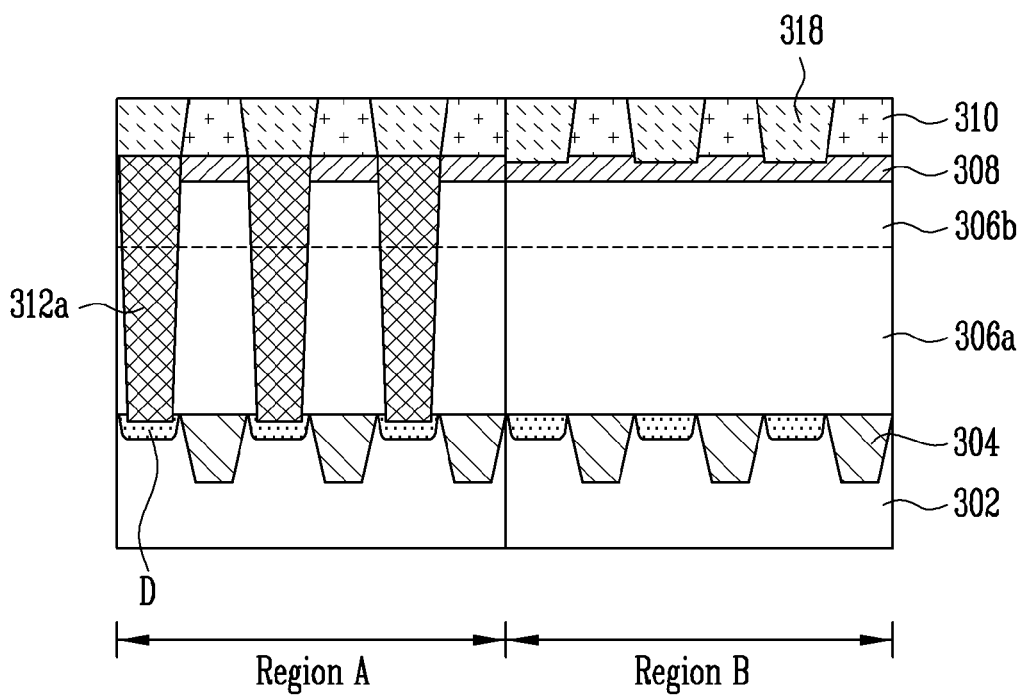

Referring to FIG. 3F, a barrier metal layer (not shown), such as a stack layer of Ti/TiN, is formed on the entire surface including the trench dielectric layer 310. A metal layer, such as tungsten (W), is then formed. A polishing process, such as a CMP process, or an etch back process is then performed in order to form metal lines 318. Meanwhile, as in the above process, if the height of the drain contact plugs 312a is lowered and the metal lines 318 are formed on the drain contact plugs 312a, resistance can be further lowered.

In accordance with a second embodiment of the present invention, since the etch-stop layer 308 does not remain between the metal lines 318, the problem of increased capacitance between the metal lines 318 due to the etch-stop layer 308 with a high dielectric constant can be prevented.

When the etch process is performed in order to form the trenches in the trench dielectric layer 310, the mask layer etched on the trench dielectric layer 310 may be formed of an amorphous carbon layer. However, the amorphous carbon layer may have particles occurring during the formation process and therefore has a difficulty in performing a micro process. Further, a SiON layer has to be additionally formed on the amorphous carbon layer in order to protect the amorphous carbon layer. Accordingly, there are problems in that a process is complicated and the cost is high. In contrast, according to the present invention, since an etch mask is formed of a conductive layer used to form the drain contact plugs, the process is simple and the expenses can be saved.

As described above, in accordance with the semiconductor device and the method of forming a metal line of a semiconductor device according to the present invention, since a hard mask with a high dielectric constant does not remain between metal lines, the capacitance of the metal lines can be reduced. Thus, margin in which the height or width of metal lines can be increased can be secured in order to reduce the resistance of the metal lines as much as that a reduced capacitance of the metal lines. Accordingly, delay caused by RC can be prevented, power consumption can be saved, and therefore device characteristics can be improved.

Further, a hard mask layer of an etch process performed to form metal lines is formed of a conductive layer for forming contact plugs. Accordingly, the process can be simplified and the production cost can be saved.

The present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

What is claimed is:

1. A method of forming metal lines of a semiconductor device, the method comprising the steps of:

forming a first insulating layer over a semiconductor substrate;
forming an etch-stop layer on the first insulating layer;
forming a second insulating layer on the etch-stop layer;
etching the second insulating layer, the etch-stop layer and the first insulating layer to form contact holes;
forming contact plugs within the contact holes;
forming trenches by etching the second insulating layer to expose the contact plugs; and
forming metal lines within the trenches.

2. The method of claim 1, wherein the etch-stop layer is formed of a material with a dielectric constant higher than that of an oxide layer.

3. The method of claim 1, wherein the etch-stop layer is formed of a nitride layer.

4. The method of claim 1, wherein the metal lines are formed using a damascene process.

5. The method of claim 1, wherein the metal lines are formed over the etch-stop layer.

6. The method of claim 1, further comprising performing a process of lowering a height of the contact plugs after the trenches are formed.

7. A method of forming metal lines of a semiconductor device, the method comprising the steps of:
forming a first insulating layer over a semiconductor substrate;
forming an etch-stop layer on the first insulating layer;
forming a second insulating layer on the etch-stop layer;
etching the second insulating layer, the etch-stop layer and the first insulating layer to form contact holes;
forming a conductive layer over the contact holes and the second insulating layer;
patterning the conductive layer to form contact plugs within the contact holes and to expose regions where metal lines will be formed;
forming trenches by etching the second insulating layer using the patterned conductive layer as an etch mask; and
forming metal lines within the trenches.

8. The method of claim 7, wherein the etch-stop layer is formed of a material with a dielectric constant higher than that of an oxide layer.

9. The method of claim 7, wherein the etch-stop layer is formed of a nitride layer.

10. The method of claim 7, wherein the metal lines are formed using a damascene process.

11. The method of claim 7, wherein the metal lines are formed over the etch-stop layer.

12. The method of claim 7, further comprising performing a process of lowering a height of the contact plugs after the second contact holes are formed.

13. The method of claim 7, wherein the metal lines are formed on the contact plugs in the second insulating layer.

* * * * *